US010692831B1

United States Patent
Bronn et al.

(10) Patent No.: US 10,692,831 B1
(45) Date of Patent: Jun. 23, 2020

(54) STUD BUMPS FOR POST-MEASUREMENT QUBIT FREQUENCY MODIFICATION

(71) Applicant: INTERNATIONAL BUSINESS MACHINES CORPORATION, Armonk, NY (US)

(72) Inventors: Nicholas T. Bronn, Long Island City, NY (US); Jared B. Hertzberg, Yorktown Heights, NY (US); Eric P. Lewandowski, White Plains, NY (US); Jae-woong Nah, Closter, NJ (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/281,770

(22) Filed: Feb. 21, 2019

(51) Int. Cl.
| | |
|---|---|
| *H01L 23/00* | (2006.01) |
| *G06N 10/00* | (2019.01) |
| *H01L 23/66* | (2006.01) |
| *H01L 21/66* | (2006.01) |
| *H01L 23/498* | (2006.01) |

(52) U.S. Cl.
CPC ............ *H01L 24/14* (2013.01); *G06N 10/00* (2019.01); *H01L 22/12* (2013.01); *H01L 22/22* (2013.01); *H01L 23/49811* (2013.01); *H01L 23/66* (2013.01); *H01L 24/81* (2013.01); *H01L 24/97* (2013.01)

(58) Field of Classification Search
CPC ......... H01L 24/14; H01L 24/97; H01L 23/66; H01L 23/49811; H01L 24/81; H01L 22/12; H01L 22/22; G06N 10/00
See application file for complete search history.

(56) References Cited

U.S. PATENT DOCUMENTS

| | | | |
|---|---|---|---|
| 9,836,699 B1 | 12/2017 | Rigetti et al. | |
| 9,859,176 B1 * | 1/2018 | Chiu | H01L 23/66 |
| 10,068,181 B1 | 9/2018 | Rigetti et al. | |
| 2018/0012932 A1 * | 1/2018 | Oliver | H01L 22/26 |
| 2018/0102470 A1 * | 4/2018 | Das | H01L 24/05 |
| 2018/0247974 A1 | 8/2018 | Oliver et al. | |
| 2019/0303788 A1 * | 10/2019 | Kelly | B82Y 10/00 |

FOREIGN PATENT DOCUMENTS

WO      2018057016 A1      3/2018

OTHER PUBLICATIONS

Rosenberg et al. ("3D integrated superconducting qubits," npj Quantum Information vol. 3, Article No. 42, 2017) (Year: 2017).*
Rosenberg et al., "3D integrated superconducting qubits", arXiv:1706. 04116v2 [quant-ph] Jun. 19, 2017.
Gambetta et al., : Building logical qubits in a superconducting quantum computing system, npj Quantum Information (2017) 3:2.

* cited by examiner

*Primary Examiner* — Yasser A Abdelaziez
(74) *Attorney, Agent, or Firm* — Harry J. Daley; Laura G. Remus; Venable LLP

(57) ABSTRACT

According to an embodiment of the present invention, a method of producing a quantum computer chip includes performing a frequency measurement on a qubit chip bonded to a test interposer chip for qubits on the qubit chip at an operating temperature of the qubit chip. The method further includes pulling the qubit chip apart from the test interposer chip after performing the frequency measurement, and modifying a frequency of a subset of qubits after pulling the qubit chip apart from the test interposer chip. The method further includes bonding the qubit chip to a device interposer chip after modifying the frequency of the subset of qubits.

24 Claims, 14 Drawing Sheets

STUD BUMPS FOR POST-MEASUREMENT QUBIT FREQUENCY MODIFICATION

BACKGROUND

The present invention relates to methods of producing quantum computer chips and the chips produced, and more particularly to methods of producing quantum computer chips including post-measurement qubit frequency modification of the chips produced.

When fixed-frequency transmons are fabricated, their actual frequency naturally deviates somewhat from the targeted fixed frequency. Consequently, for a chip that has a plurality of fixed frequency qubits, there will be an innate frequency spread for the population of qubits that is too high to reliably allow for the operation of cross resonance gates between every pair of qubits. The frequency spread results in "frequency collisions," in which an undesired ZZ-interaction between a pair of qubits is too large perform a cross resonance gate, or else causes slow cross resonance gates due to the large detuning between a pair of qubits. Post-measurement annealing and lithographic modification can modify the qubit frequency by changing the Josephson junction inductance or capacitance, for example, by removing dielectric. However, post-measurement frequency modification often requires access to qubits on the qubit chip after the qubit chip is assembled on a substrate with readout circuits (or parts thereof). As quantum processors move to high density, flip chip-to-chip bump bonding becomes necessary. The qubit chip may be flip chip bonded to an interposer chip to perform measurements on the qubit chip, and to form a quantum-computer chip. However, currently, once the qubit chip is flip chip bonded to the interposer chip, it is no longer possible to access the qubit chip to perform frequency modification.

SUMMARY

According to an embodiment of the present invention, a method of producing a quantum computer chip includes performing a frequency measurement on a qubit chip bonded to a test interposer chip for qubits on the qubit chip at an operating temperature of the qubit chip. The method further includes pulling the qubit chip apart from the test interposer chip after performing the frequency measurement, and modifying a frequency of a subset of qubits after pulling the qubit chip apart from the test interposer chip. The method further includes bonding the qubit chip to a device interposer chip after modifying the frequency of the subset of qubits.

The method enables post-measurement modification of the qubit frequency by providing access to the qubit chip after the chip has been cooled and a measurement has been performed at low temperature. The low temperature frequency measurement is more accurate than room-temperature measurements that predict the frequency, and enables subsequent precise qubit frequency modification that prevents frequency collisions between qubits.

DETAILED DESCRIPTION

Figure 1:
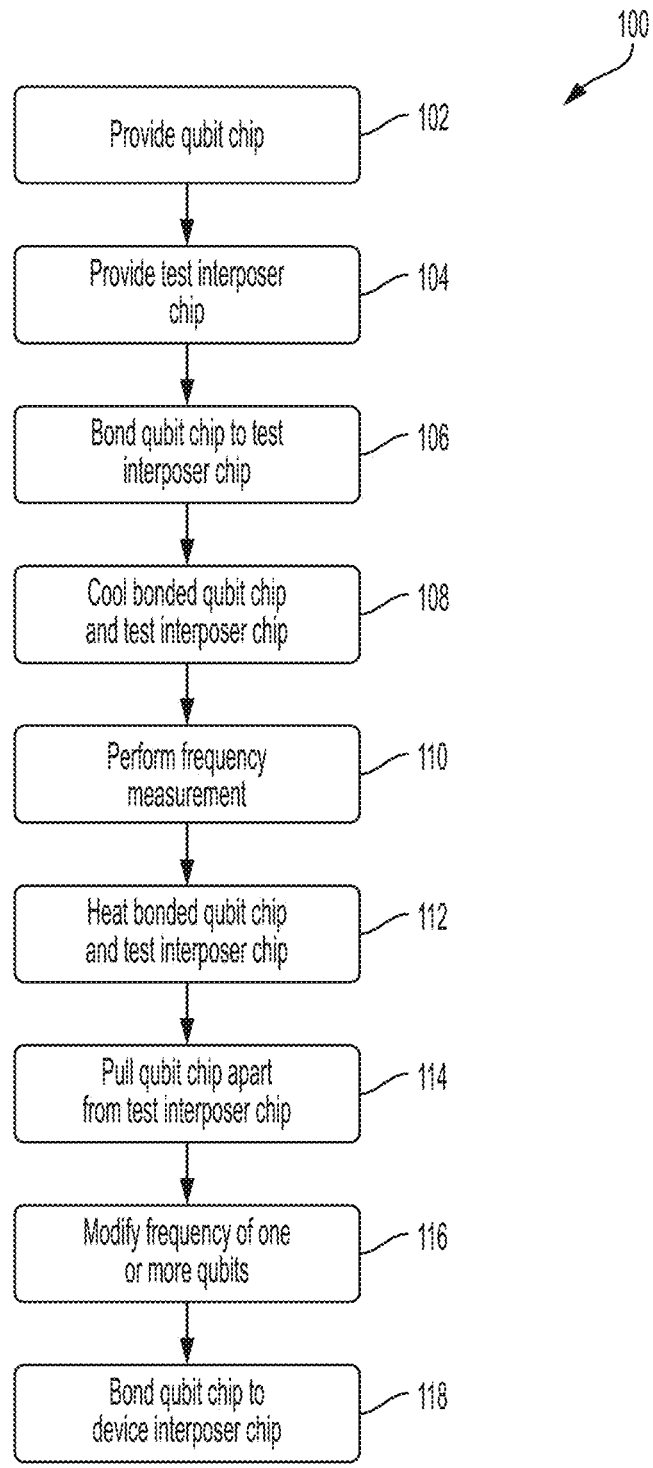
FIG. 1 is a flowchart that illustrates a method of producing a quantum computer chip according to an embodiment of the current invention.

FIG. 1 is a flowchart that illustrates a method 100 of producing a quantum computer chip according to an embodiment of the current invention. The method 100 includes providing a qubit chip 102, and providing a test interposer chip that has at least a portion of a readout circuit 104. The method 100 further includes bonding the qubit chip to the test interposer chip 106, and cooling the bonded qubit chip and test interposer chip to an operating temperature of the qubit chip 108. In some embodiments, more than one qubit chip can be bonded on a test interposer chip. The method 100 further includes performing a frequency measurement 110 on the cooled bonded qubit chip and test interposer chip for qubits on the qubit chip using the readout circuit. The method 100 further includes pulling the qubit chip apart from the test interposer chip 114 after performing the frequency measurement 110. The method 100 further includes modifying a frequency of a subset of qubits 116 after pulling the qubit chip apart from the test interposer chip 114, and bonding the qubit chip to a device interposer chip 118 after modifying the frequency of the subset of qubits 116. In some embodiments, more than one qubit chip can be bonded on a device interposer chip.

According to an embodiment of the invention, the method does not include providing the qubit chip 102, providing the test interposer chip 104, bonding the qubit chip to the test interposer chip 106, and cooling the bonded qubit chip and test interposer chip 108. For example, the qubit chip and test interposer chip may be fabricated and bonded beforehand, for example, by a manufacturer. Thus, the method may begin with performing the frequency measurement 110 on a qubit chip bonded to a test interposer chip.

As used herein, a qubit chip is a chip that includes a substrate and at least one quantum bit (qubit) formed thereon. In some embodiments, the qubit may be a superconducting qubit. The qubit may include one or more Josephson junctions, for example. In some embodiments, the qubit may be a transmon. In some embodiments, the qubit chip includes superconducting wiring formed on the substrate. The qubit chip may include a thin under bump metallurgy (UBM) pad formed on the superconducting wiring that becomes superconducting by virtue of the proximity effect. In some embodiments, the qubit chip includes a readout resonator or part of a readout resonator.

As used herein, an interposer chip is a chip that includes a substrate and superconducting wiring formed on the substrate. The interposer chip may include at least one thin UBM pad disposed on the metal interconnects that becomes superconducting by virtue of the proximity effect. In some embodiments, the interposer chip includes a readout circuit. The readout circuit may be a readout resonator or part of a readout resonator, for example. The interposer chip may be a test interposer used for testing the qubits, or a device interposer chip to be incorporated into a quantum computing device. In some embodiments, the device interposer chip is the test interposer chip reused. In some embodiments, the device interposer chip is bonded to the qubit chip via cold welding.

In a quantum computing device, the qubits are coupled to each other by a physical connection, for example, capacitively or by coupling to a coplanar waveguide bus. As the number of coupled qubits increases, the space on the qubit chip becomes a limiting factor. Moving the readout resonator or a portion of the readout resonator to the interposer chip enables more qubits to be formed on the qubit chip. Since this is true for the device interposer chip, it must also be true for the test interposer chip.

Pulling the qubit chip apart from the test interposer chip means applying a force to at least one of the qubit chips and the test interposer chip to physically separate the qubit chip from the test interposer chip. The pulling will result in the breaking of bonds between studs on the qubit chip and solder bumps on the test interposer chip. However, some solder material from the solder bump may remain adhered to the stud after the pulling. The pulling does not require chemical treatment or annealing of the qubit chip. Consequently, the qubit chip and interposer chip are separated while avoiding damage to the qubits on the qubit chip.

Low temperatures at which qubits may operate are defined as temperatures that are sufficiently below the critical temperatures of the superconductors involved and the temperature corresponding to the qubit transition frequency. There are two relevant temperature scales for qubits: the critical temperature (Tc) of the superconductors that make up the qubit, and the thermal energy ($k_B$ T) corresponding to the temperature of the qubit. Tc is relevant because the metals are normal and resistive above that temperature. Also, quasiparticle density goes down with temperature below Tc. $k_B$ T must be much less than the energy corresponding to the qubit transition frequency (hf) so that thermal fluctuations do not cause much decoherence. According to an embodiment of the invention, a sufficiently low temperature is a temperature that is a small fraction of the lower of Tc and the temperature corresponding to the qubit transition frequency. The small fraction may be about $1/10$, $1/15$, or $1/20$, for example. According to an embodiment of the invention, if the critical temperature is 1.2 K and the qubit transition frequency corresponds to a temperature of 250 mK, a temperature less than 20 mK can be sufficiently low.

The frequency of the qubit corresponds to the transition energy between the two states of the qubit being used for computation. A qubit has two quantum states that are sufficiently separated in energy and/or decoupled from any additional quantum states so that the qubit is approximately a two-quantum state structure under operation conditions. The transition energy between the two states is a fixed quantity that defines the frequency of the qubit. For some qubits, the transition energy can nonetheless be modified, for example, by annealing the qubit with a laser.

The method 100 enables the potential for frequency modification feedback because the method provides access to the Josephson junctions formed on the qubit chip after the frequency of the qubits has been measured. The qubit can be modified using any conventional method currently in existence or developed in the future. Non-lithographic modification of the qubits can be performed by laser annealing the Josephson junction and/or laser ablation of dielectric or conductive material, tribological modification (i.e., with a nanoindentor), or dry etching through a hard mask. Lithographic methods may also be used. In particular, lithographic methods with a thick resist and low bake temperature may be employed. Soft lithography may also be used. Negative resists that can be patterned greater than 100 μm, such as SU-8, KMPR, and JSR for spin on or spray on resists, can be used. A positive resist could also be used by spraying and exposing with a direct write laser. This would allow a thinner resist to be used, which would prevent the stud bumps from being covered. Also, positive resists may have lower bake temperatures.

Direct access to the qubit surface enables inspection such as microscopy or electrical resistance measurements of junctions or other structures on the surface, to confirm the modification. Without access to the Josephson junction, the qubit frequencies may be modified only by techniques that penetrate either the interposer (above) or qubit substrate (below) without causing undesired damage. Such techniques will be more difficult, limited and imprecise than if the interposer is removed and the qubit surface is directly accessible.

Performing laser annealing through the interposer chip requires the interposer chip to have a transparent substrate or machined windows. The transparent substrate or machined windows may require additional fabrication steps. Further, the transparent substrate may introduce two-level systems that decrease qubit coherence and reliability. The machined windows may have stress concentration and handling issues that reduce coherence and reliability.

Alternatively, the qubit frequencies may be modified using backside qubit chip frequency modification, which requires a thinned qubit die. The thinned qubit die is susceptible to stress concentration and handling issues that can negatively impact coherence and reliability.

In contrast, the method 100 does not create coherence or reliability penalties. Further, the method 100 enables a more accurate final Josephson junction frequency prediction than other methods. The frequency of the qubits can be modified, for example, by laser annealing or ablation, based on the cold-temperature frequency predictions. However, the broad concepts of the current invention are not limited to only laser modification of the qubits. Room temperature (RT) Josephson junction resistance as a qubit frequency predictor is not accurate enough to guarantee lack of frequency collisions due to inherit correlation error and capacitor fabrication tolerances. Table 1 shows yield predictions for qubit chips with 24, 28, 54, and 73 qubits arranged in progressively larger implementations of a common topology. The numbers indicate how many chips are tested before a functional qubit chip is realized.

TABLE 1

Yield Predictions

| | 24Q | 28Q | 54Q | 73Q |
|---|---|---|---|---|
| Threshold number of gate 'collisions' satisfying room-T screening | 3 | 5 | 11 | 17 |
| Number of chips to screen with RT resistance | | | | |
| No modification | 200 | 10,000 | >>10,000 | >>10,000 |
| No accessibility to junction after cooldown | 45 to 135 | 195 to 585 | 6000 to 18,000 | 50,000 to 150,000 |
| Qubit modification possible after cooldown | 5 to 15 | 15 to 45 | 30 to 90 | 50 to 150 |
| Number of chips to cool | | | | |
| No qubit modification | 9 | 13 | 200 | 1000 |
| No accessibility to junction after cooldown | 9 | 13 | 200 | 1000 |
| Qubit modification possible after cooldown | 1 | 1 | 1 | 1 |

Once the qubits are screened, the chips with appropriate RT resistance patterns will bonded and cooled. As a result, no qubit modification ($3^{rd}$ to last row) is the same as no accessibility to the junction ($2^{nd}$ to last row). This is in contrast to the case of the number of chips to screen at room temperature because there are more stringent requirements on the RT resistance conditions if post-measurement modification cannot be made. For example, for a 54Q chip, for every chip that look "as good as can be" at RT, only one will turn out to have no collisions once the qubits are measured. Given strictly random qubit frequencies arising from fabrication, >>10 k chips (many more than the number of tries in the model used to simulate the date in Table 1) are required in order to find a chip that looks "as good as can be" at RT. As a further example, given a modest ability to tune at RT before cooling, 6 k to 18 k chips are required in order to find a chip whose resistances at RT are suitable for tuning into an "as good as can be" RT configuration. In contrast, if just one chip is produced that is "as good as can be" at RT, then cooled, frequency measured, warmed, pulled, and qubit frequency modified, the method according to embodiments of the invention can nearly guarantee zero collisions. Thus, the last line of Table 1 is "1."

As shown in the last two rows, the method 100 reduces the number of tested chips from 9 to 1 for a 24-qubit chip, and from 1000 to 1 for a 73-qubit chip. The method 100 includes cooling the bonded qubit chip and test interposer chip to low temperatures at which qubits may operate, enabling an accurate frequency measurement to be taken. This frequency measurement is used to perform a highly accurate frequency modification of the qubits after the chip is warmed. Tuning qubits based on their known and measured frequencies is far more accurate than tuning them based on room-temperature-based estimates.

The method 100 enables multiple bondings and debondings of a qubit chip from an interposer chip without chemical treatments or global annealing of qubit chip. The method 100 is compatible with cases in which the metal bump forms part of a resonator. The method 100 allows lithographic or non-lithographic qubit modification (i.e. laser annealing or ablation) while leaving stud bumps intact, and drastically increases the probability of obtaining a quantum processor of a scale greater than 50 qubits in number with all two-qubit gates functional.

Figure 2:
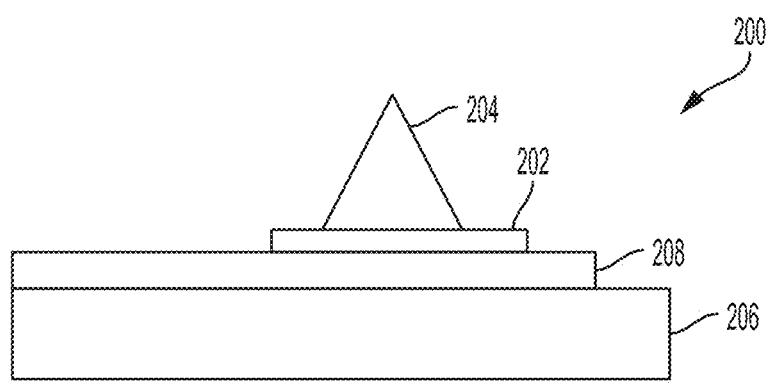
FIG. 2 is a schematic illustration of a qubit chip according to an embodiment of the current invention.

FIG. 2 is a schematic illustration of a qubit chip 200 according to an embodiment of the current invention. The qubit chip 200 includes at least one metallic pad 202 and a metallic stud 204 formed on the at least one metallic pad 202. According to an embodiment of the invention, the qubit chip 200 further includes a qubit substrate 206, and superconducting wiring 208 formed on the qubit substrate 206. The metallic pad 202 may be formed on the superconducting wiring 208. Although the qubit chip 200 includes qubits, the qubits are not shown in FIG. 2. The configuration shown in FIG. 2 may be used for non-critical ground bumps.

Figure 3:
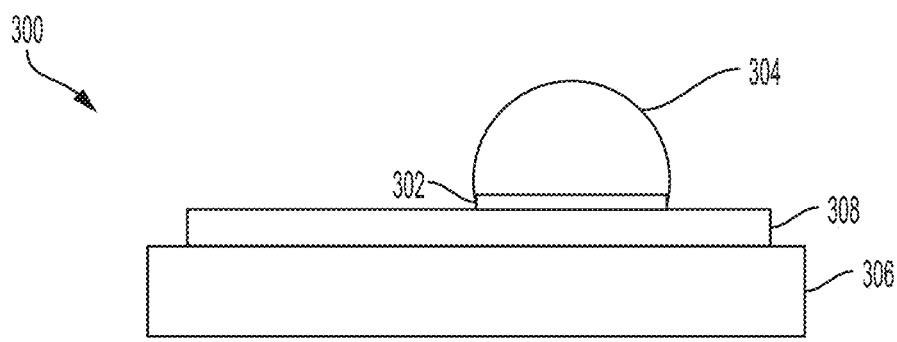
FIG. 3 is a schematic illustration of a test interposer chip according to an embodiment of the current invention.

FIG. 3 is a schematic illustration of a test interposer chip 300 according to an embodiment of the current invention. The test interposer chip 300 comprises at least one metallic pad 302 and a test solder bump 304 formed on the at least one metallic pad 302. According to an embodiment of the invention, the test interposer chip 300 further includes an interposer substrate 306, and superconducting wiring 308 formed on the interposer substrate 306. The metallic pad 302 may be formed on the superconducting wiring 308.

Figure 4:
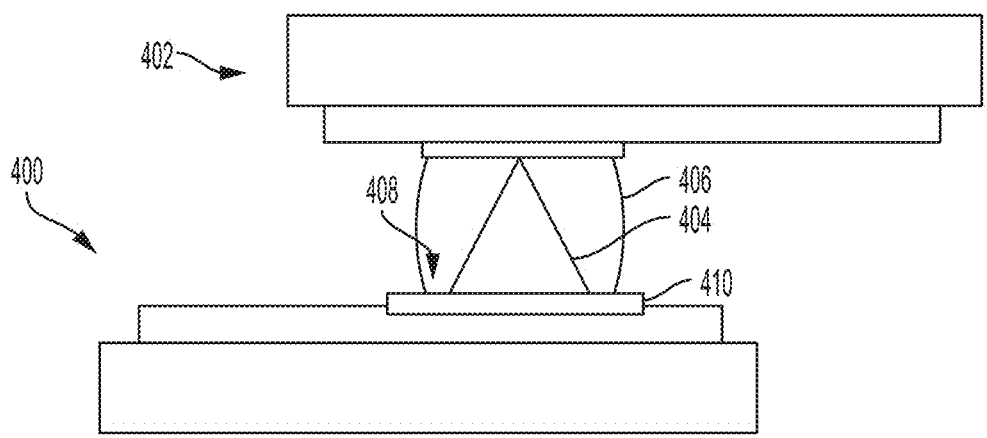
FIG. 4 is a schematic illustration of the bonded qubit chip and test interposer chip according to an embodiment of the invention.

According to an embodiment of the current invention, bonding the qubit chip to the test interposer chip in block 106 of FIG. 1 includes bonding the metallic stud formed on the at least one qubit chip to the test solder bumps formed on the test interposer chip. FIG. 4 is a schematic illustration of the bonded qubit chip 400 and test interposer chip 402 according to an embodiment of the invention. The metallic stud 404 formed on the qubit chip 400 is bonded to the test solder bump 406 formed on the test interposer chip 402. The metallic pad 410 is significantly larger than the metallic stud 404 so as to enable a superconducting interconnect between the test solder bump 406 and the metallic pad 410.

Figure 5:
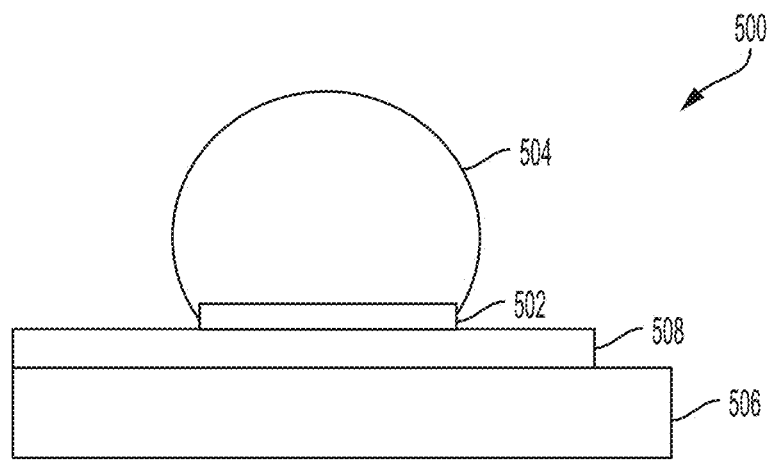
FIG. 5 is a schematic illustration of a device interposer chip according to an embodiment of the current invention.

FIG. 5 is a schematic illustration of a device interposer chip 500 according to an embodiment of the current invention. The device interposer chip 500 includes at least one metallic pad 502 and a device solder bump 504 formed the metallic pad 502. According to an embodiment of the invention, the device interposer chip 500 further includes an interposer substrate 506, and superconducting wiring 508 formed on the interposer substrate 506. The metallic pad 502 may be formed on the superconducting wiring 508. The device solder bump 504 may be larger than the test solder bump so that the fresh solder can contact the metallic pad on the qubit chip, for example, metallic pad 202 on the qubit chip 200 in FIG. 2.

Figure 6:
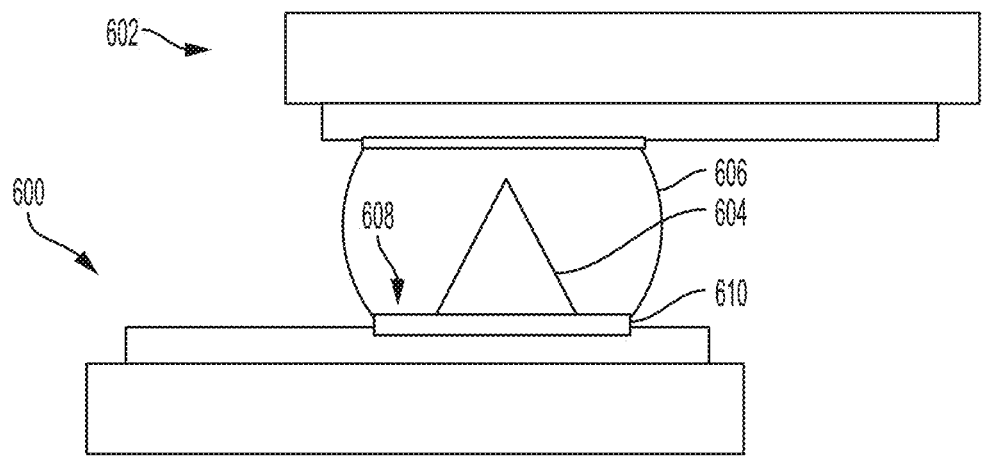
FIG. 6 is a schematic illustration of the bonded qubit chip and device interposer chip according to an embodiment of the invention.

According to an embodiment of the current invention, bonding the qubit chip to the device interposer chip in block 118 of FIG. 1 includes bonding the metallic studs formed on the qubit chip to the device solder bumps formed on the device interposer chip. FIG. 6 is a schematic illustration of the bonded qubit chip 600 and device interposer chip 602 according to an embodiment of the invention. The metallic stud 604 formed on the qubit chip 600 is bonded to the device solder bump 606 formed on the device interposer chip 602. The device solder bump 606 may contact a larger portion of the metallic pad 610 than the test solder bump. The device solder bump 606 and the metallic pad 610 may be designed such that the entire metallic pad 610 is encapsulated with solder.

According to an embodiment of the invention, the test solder bumps contact a first area of the metallic pads on which the metallic studs are formed, and the device solder bumps contact a second area of the metallic pads on which the metallic studs are formed. At least a portion of the second area is different from the first area. For example, the test solder bump 406 in FIG. 4 contacts a first area 408 of the metallic pad 410 on which the metallic stud 404 is formed. The device solder bump 606 in FIG. 6 contacts a second area 608 of the metallic pad 610 on which the metallic stud 604 is formed. At least a portion of the second area 608 is different from the first area. For example, the second area may be larger than the first area. Because the device solder bump 606 extends farther from the metallic stud 604 than the test solder bump 406 extends from the metallic stud 404, the device solder bump 606 contacts a region of the metallic pad 610 that was not previously contacted by the test solder bump 406.

Figure 7:
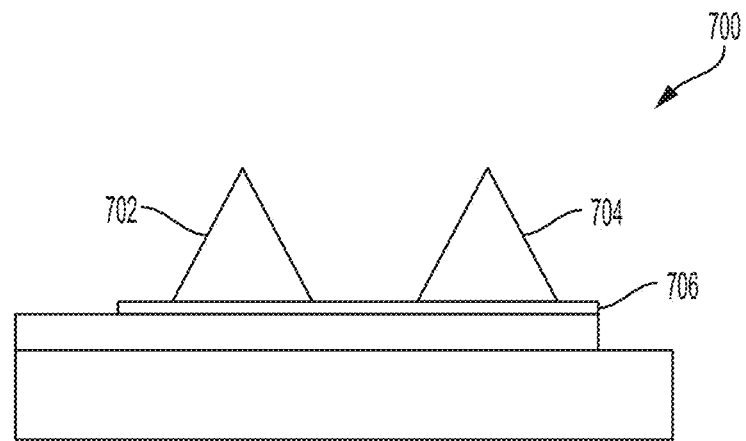
FIG. 7 is a schematic illustration of a qubit chip according to an embodiment of the invention.

FIG. 7 is a schematic illustration of a qubit chip 700 according to an embodiment of the invention. In addition to the first metallic stud 702, the qubit chip further includes a second metallic stud 704 formed on the metallic pad 706. This configuration may be used for critical ground and/or signal bumps for enhanced reliability and yield. The metallic pad 706 is significantly larger than the first metallic stud 702 and the second metallic stud 704 so as to enable a superconducting interconnect between the solder and metallic pad 706.

Figure 8:
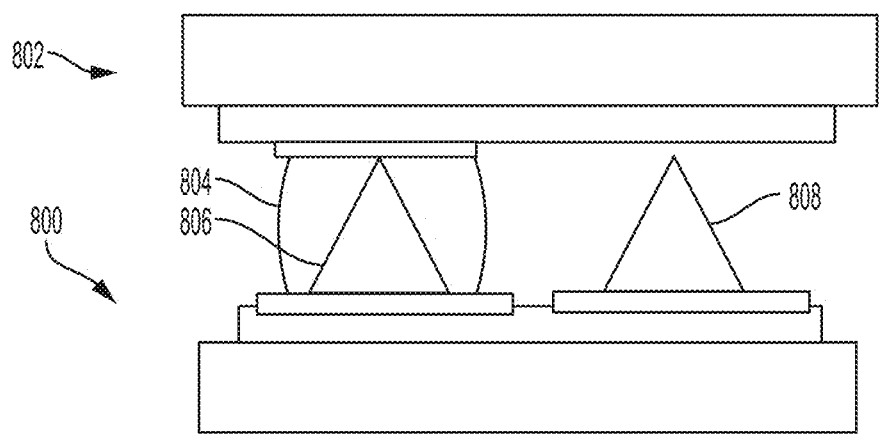
FIG. 8 is a schematic illustration of a qubit chip bonded to a test interposer.

When the qubit chip is bonded to the test interposer chip, only one of the metallic studs is bonded to the test interposer chip. FIG. 8 is a schematic of the test interposer chip 800 bonded to the qubit chip 802. The test interposer chip 800 has a test interposer bump 804 that is bonded to the first metallic stud 806. The second metallic stud 808 is not bonded.

Figure 9:
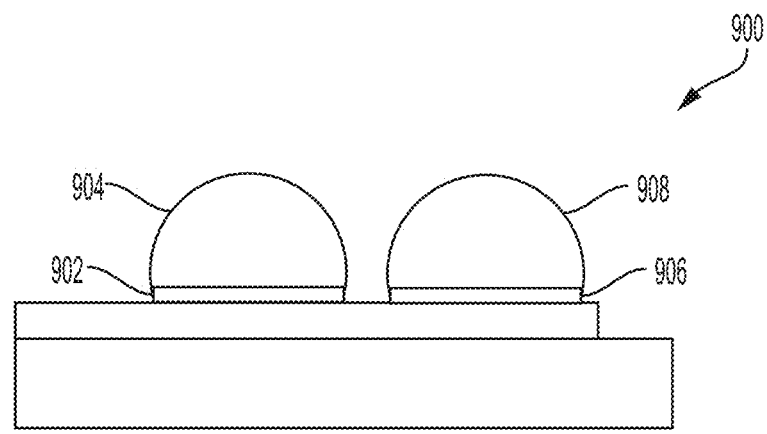
FIG. 9 is a schematic illustration of a device interposer chip according to an embodiment of the invention.

After pulling the interposer chip 802 apart from the qubit chip 800 and modifying the frequency of qubits on the qubit chip, the method according to an embodiment of the invention includes bonding the qubit chip 800 to a device interposer chip having two device solder bumps. FIG. 9 is a schematic illustration of a device interposer chip 900 according to an embodiment of the invention. In addition to the first metallic pad 902 and the first device solder bump 904, the device interposer chip 900 includes a second metallic pad 906 and a second device solder bump 908 formed on the second metallic pad 906. One bump may be used to shield the metallic stud that was bonded to the test solder bump, while the other bump may act as the main signal or ground interconnect. The size of the device solder bumps may be greater than that of the test solder bumps, so that the fresh solder can contact the metallic pad formed on the qubit chip.

Figure 10:
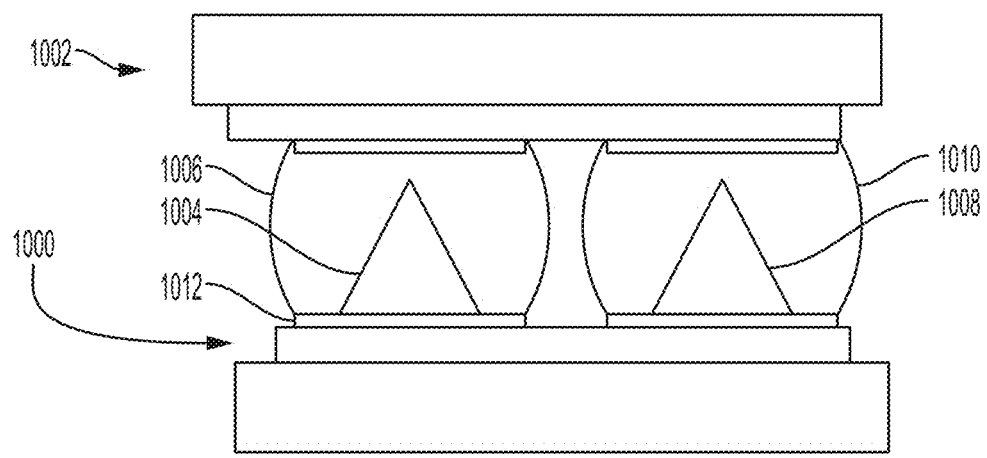
FIG. 10 is a schematic illustration of the qubit chip bonded to the device interposer chip.

FIG. 10 is a schematic illustration of the qubit chip 1000 bonded to the device interposer chip 1002. A first metallic stud 1004 is bonded to a first device solder bump 1006, and a second metallic stud 1008 is bonded to a second device solder bump 1010. The first device solder bump 1006 may contact an area of the metallic pad 1012 that the test solder bump 804 in FIG. 8 did not contact. The first metallic stud 1004 is bonded to the first device solder bump 1006 to prevent losses in the case the first metallic stud 1004 is resistive.

Figure 11:
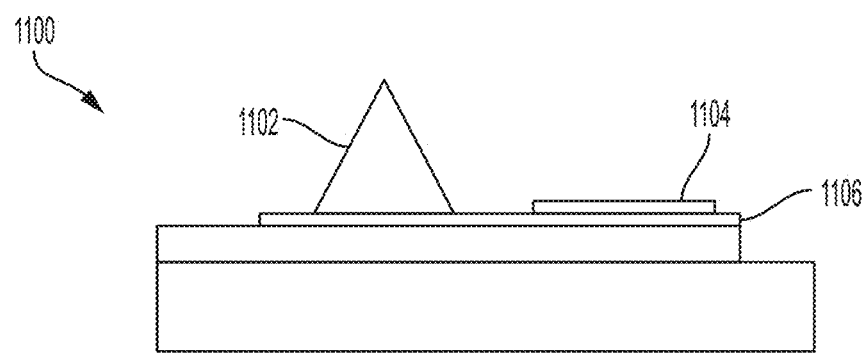
FIG. 11 is a schematic illustration of a qubit chip according to an embodiment of the invention.

FIG. 11 is a schematic illustration of a qubit chip 1100 according to an embodiment of the invention. In addition to the metallic stud 1102, the qubit chip 1100 further includes at least one metallic plated pillar 1104 formed on each metallic pad 1106. This configuration may be used for critical ground and/or signal bumps for enhanced reliability and yield. The metallic pad 1106 is significantly larger than the metallic stud 1102 and the metallic plated pillar 1104 so as to enable a superconducting interconnect between the solder and metallic pad 1106.

Figure 12:
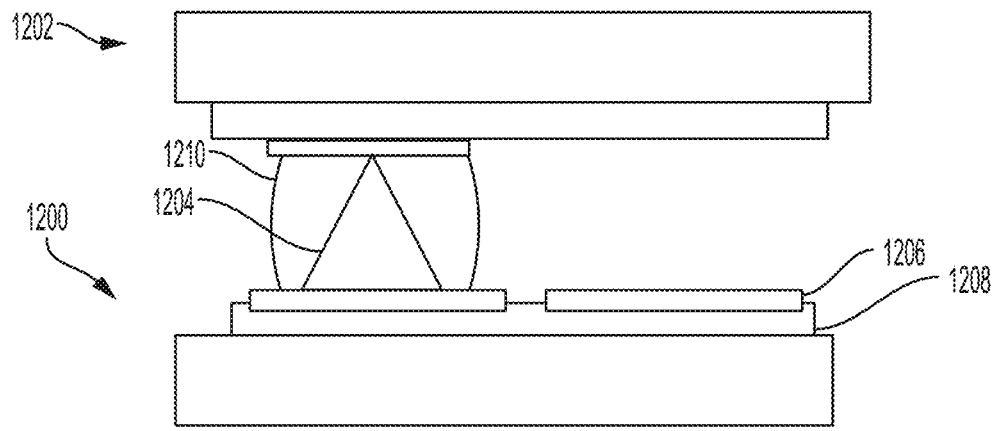
FIG. 12 is a schematic illustration of a qubit chip bonded to a test interposer chip 1202.

The method according to an embodiment of the invention includes bonding the metallic stud 1102 to a test solder bump on the test interposer chip, but not bonding the metallic plated pillar 1104 to the test interposer chip. FIG. 12 is a schematic illustration of a qubit chip 1200 bonded to a test interposer chip 1202. The qubit chip 1200 includes a metallic stud 1204 and a metallic plated pillar 1206 formed on the metallic pad 1208. The method according to an embodiment includes bonding the metallic stud 1204 to test solder bump 1210. The metallic plated pillar 1206 remains unbonded.

Figure 13:
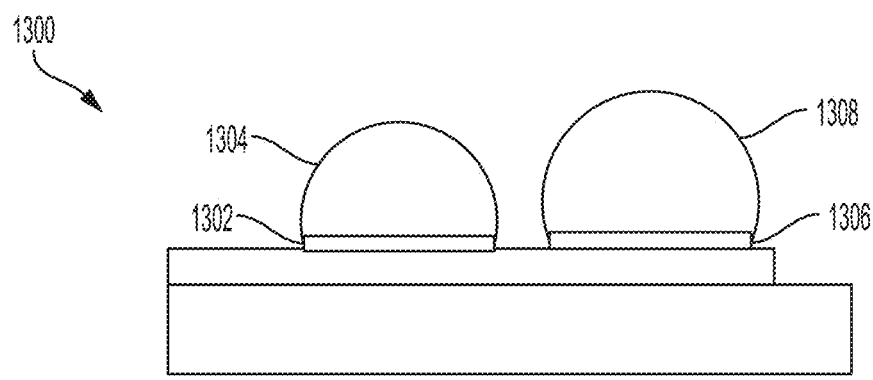
FIG. 13 is a schematic illustration of a device interposer chip according to an embodiment of the invention.

After pulling the interposer chip 1202 apart from the qubit chip 1200 and modifying the frequency of qubits on the qubit chip 1200, the method according to an embodiment of the invention includes bonding the qubit chip 1200 to a device interposer chip having two device solder bumps. FIG. 13 is a schematic illustration of a device interposer chip 1300 according to an embodiment of the invention. In addition to a first metallic pad 1302 and a first device solder bump 1304 formed on the first metallic pad 1302, the device interposer chip 1300 further comprises at least one second metallic pad 1306 and a second device solder bump 1308 formed on the second metallic pad 1306. The second device solder bump 1308 may have a larger volume than the first device solder bump 1304 in order to span the distance from the second metallic pad 1306 to the metallic plated pillar. The first device solder bump 1304 and the second device solder bump 1308 may both be larger than the test solder bump so that fresh solder can contact the metallic pad formed on the qubit chip.

Figure 14:
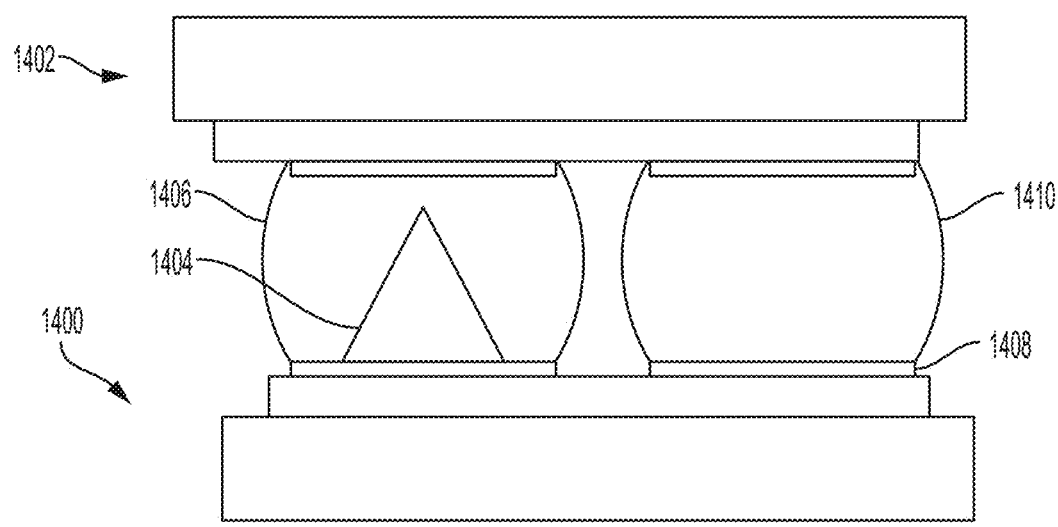
FIG. 14 is a schematic illustration of a qubit chip bonded to a device interposer chip 1402.

FIG. 14 is a schematic illustration of a qubit chip 1400 bonded to a device interposer chip 1402. According to an embodiment of the invention, in addition to bonding the metallic stud 1404 to the first device solder bump 1406, the method includes bonding the metallic plated pillar 1408 formed on the qubit chip 1400 to the second device solder bump 1410 formed on the device interposer chip 1402. Bonding the metallic stud 1404 to the first device solder bump 1406 may prevent losses.

Figure 15:
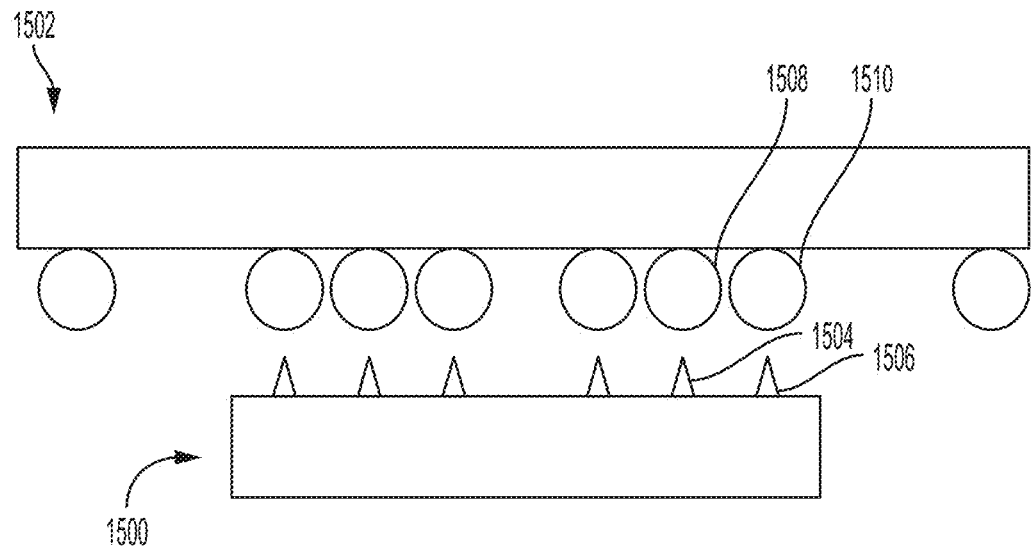
FIG. 15 is a schematic drawing of an unbonded qubit chip and interposer chip.

According to an embodiment of the invention, the qubit chip includes a plurality of metallic studs, the test interposer chip includes a plurality of test solder bumps, and the device interposer chip includes a plurality of device solder bumps. FIG. 15 is a schematic drawing of an unbonded qubit chip 1500 and interposer chip 1502. The qubit chip includes a plurality of metallic studs 1504, 1506. The interposer chip 1502 includes a plurality of solder bumps 1508, 1510. The interposer 1502 may be an example of a test interposer chip or a device interposer chip.

Figure 16:
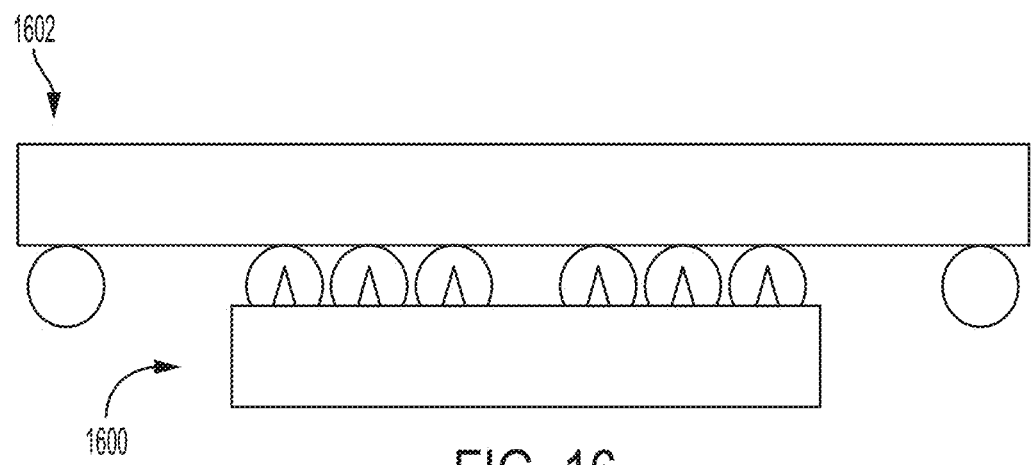
FIG. 16 is a schematic drawing of a bonded qubit chip and interposer chip.

FIG. 16 is a schematic drawing of a bonded qubit chip 1600 and interposer chip 1602. In FIG. 16, the number of solder bumps on the interposer chip 1602 is equal to the number of metallic studs on the qubit chip 1600. However, all embodiments of the invention are not limited to equal numbers of solder bumps and metallic studs. For example, according to an embodiment of the invention, the number of test solder bumps formed on the test interposer chip is less than the number of metallic studs on the qubit chip. In this embodiment, bonding the qubit chip to the test interposer chip includes bonding a subset of the plurality of metallic studs to the plurality of test solder bumps. Reducing the number of bonds between the test interposer chip and the qubit makes it easier to separate the qubit chip from the test interposer chip during the pulling. In an embodiment of the invention, each of the metallic studs is bonded to a device solder bump formed on the device interposer chip.

Figure 17:
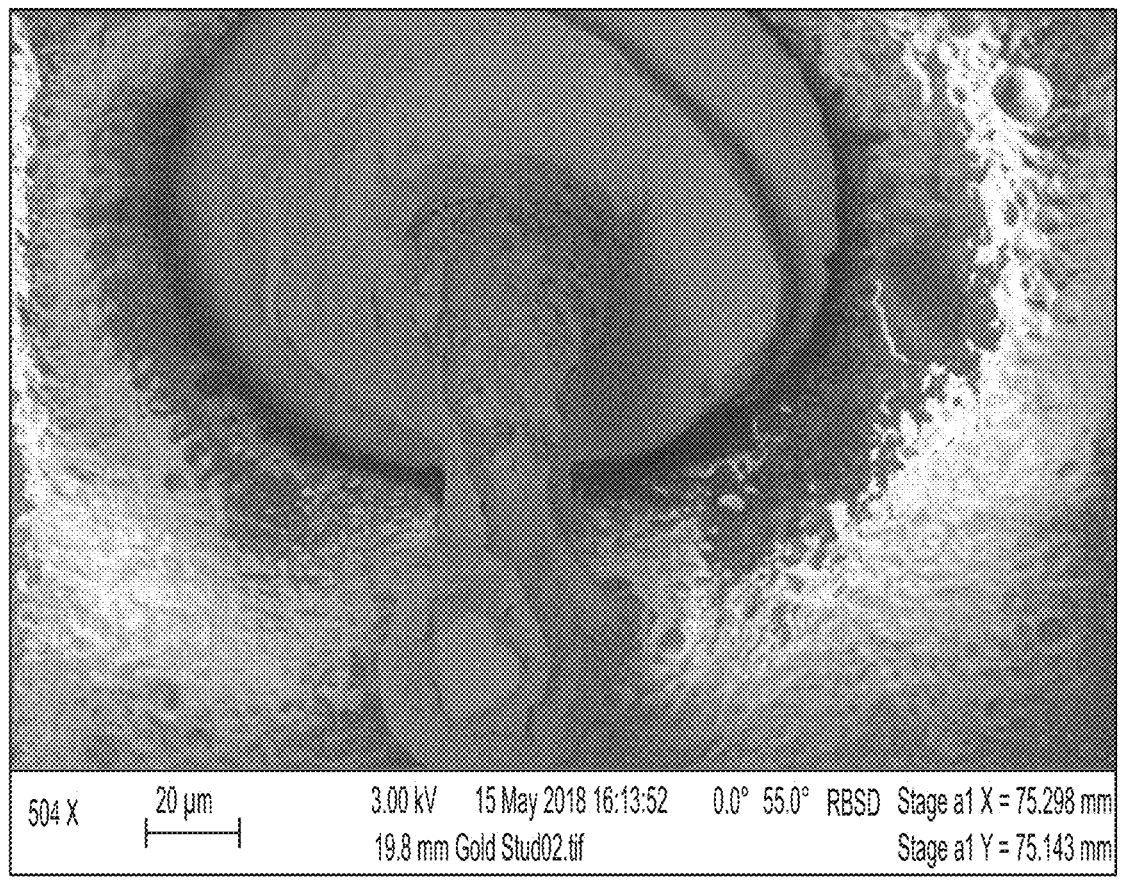
FIG. 17 is an image of metallic stud on a qubit chip after the qubit chip has been bonded to and pulled apart from a test interposer chip.

According to an embodiment of the invention, the test interposer chip including a plurality of test solder bumps is reused as the device interposer chip including a plurality of device solder bumps. For example, the method may include cleaning the test solder bumps from the test interposer chip and forming the device solder bumps on the cleaned test interposer chip via reflow. Because the test interposer chip does not include Josephson junctions, it may be subjected to chemical cleans, etches, etc. In contrast, the Josephson junctions formed on the qubit chip are sensitive to processing and would likely be damaged if cleaning processes were applied to them. FIG. 17 is an image of metallic stud on a qubit chip after the qubit chip has been bonded to and pulled apart from a test interposer chip. As shown in FIG. 17, the metallic stud is intact, and can be bonded to a device interposer bump formed on a device interposer chip.

According to an embodiment of the invention, the qubit chip further includes a plurality of metallic plated pillars. Bonding the qubit chip to the test interposer chip includes bonding the plurality of metallic studs to the plurality of test solder bumps. Bonding the qubit chip to the device interposer chip comprises bonding the plurality of metallic plated pillars to a first plurality of the plurality of device solder bumps, and bonding the plurality of metallic plated pillars to a second plurality of the plurality of device solder bumps.

According to an embodiment of the invention, a quantum computer chip is produced according to the methods described herein. According to an embodiment of the invention, the qubit chip includes at least one metallic pad and a metallic stud formed on each metallic pad, the test interposer chip includes at least one metallic pad and a test solder bump formed on each metallic pad, and the device interposer chip comprises at least one metallic pad and a device solder bump formed on each metallic pad. The metallic studs formed on the qubit chip are bonded to the device solder bumps formed on the device interposer chip to form the quantum computer chip, as shown in FIG. 6.

According to an embodiment of the invention, the test solder bump is formed from a material that is superconducting, and the device solder bump is formed from a material that is superconducting. Table 2 shows material characteristics according to an embodiment of the invention.

TABLE 2

| Material Characteristics | | | |
|---|---|---|---|
| | Qubit Chip | Test Interposer | Device Interposer |
| Qubit | ✓ | | |
| Studs on qubit chip | X | | |
| Resonators (including studs/bump) | ✓ | ✓ | ✓ |
| Pads for studs/bumps | ✓ | X | ✓ |
| Signal solder bumps | | X | ✓ |
| Ground solder bumps | | X | ✓ |

✓ = Superconducting
X = Superconducting Not Required

As shown in Table 2, the metallic studs on the qubit chip and the corresponding interposer solder bumps on the interposer chip may be formed from a superconducting material. However, the embodiments of the invention are not limited to studs and bumps formed from superconducting materials, nor are they limited to material characteristics shown in Table 2. The material characteristics shown in Table 2 are provided as an example. According to an embodiment of the invention, the stud bumps are gold and the solder bumps are indium. According to an embodiment of the invention, the metallic pads are Au/Pd/Ti. The broad concepts of the current invention are not limited to only these examples.

According to an embodiment of the invention, the quantum computer chip produced according to the methods described herein further includes a qubit chip having a second metallic stud formed on each metallic pad, and the device interposer chip further includes at least one second metallic pad and a second device solder bump formed on each second metallic pad. The second metallic studs are bonded to the second device solder bumps, as schematically illustrated in FIG. 10.

According to an embodiment of the invention, the quantum computer chip produced according to the methods described herein further includes a qubit chip further having at least one metallic plated pillar formed on each metallic pad, and the device interposer chip further includes at least one second metallic pad and a second device solder bump formed on each second metallic pad. The metallic plated pillars are bonded to the second device solder bumps, as schematically illustrated in FIG. 14.

According to an embodiment of the invention, the method 100 further includes performing resistance measurements across Josephson junctions formed on the qubit chip prior to bonding the qubit chip to the test interposer chip. This can be done at room temperature or colder. According to an embodiment of the invention, the method 100 further includes heating the bonded qubit chip and test interposer chip to a temperature at which the modifying the frequency can be performed.

Figure 24:
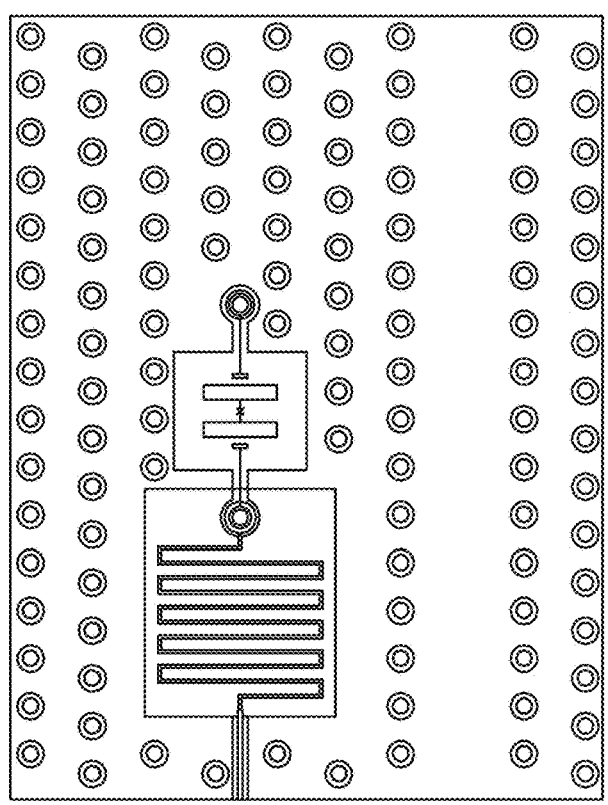
FIG. 24 is a schematic illustration of the qubit chip bonded to the device interposer chip.

According to an embodiment of the invention, the quantum computer chip produced according to the methods described herein has a qubit chip and a device interposer chip, wherein a portion of the qubit chip and a portion of the device interposer chip form readout resonators. For example, a portion of the qubit chip and a portion of the device interposer chip may form a lumped-element resonator with the capacitor formed on the qubit chip and inductor formed on the device interposer (FIG. 24). As only one initial test is expected (Table 1), and the method may use different styles of resonators, for example, larger distributed resonators on the test interposer chip, where the readout resonators can be multiplexed onto a single feedline (FIG. 21), may be used because space is less of a concern. Smaller lumped-element resonators could then be used for the final quantum computing chip where each resonator needs to be individually connected to control and/or measurement instruments.

Figure 18:
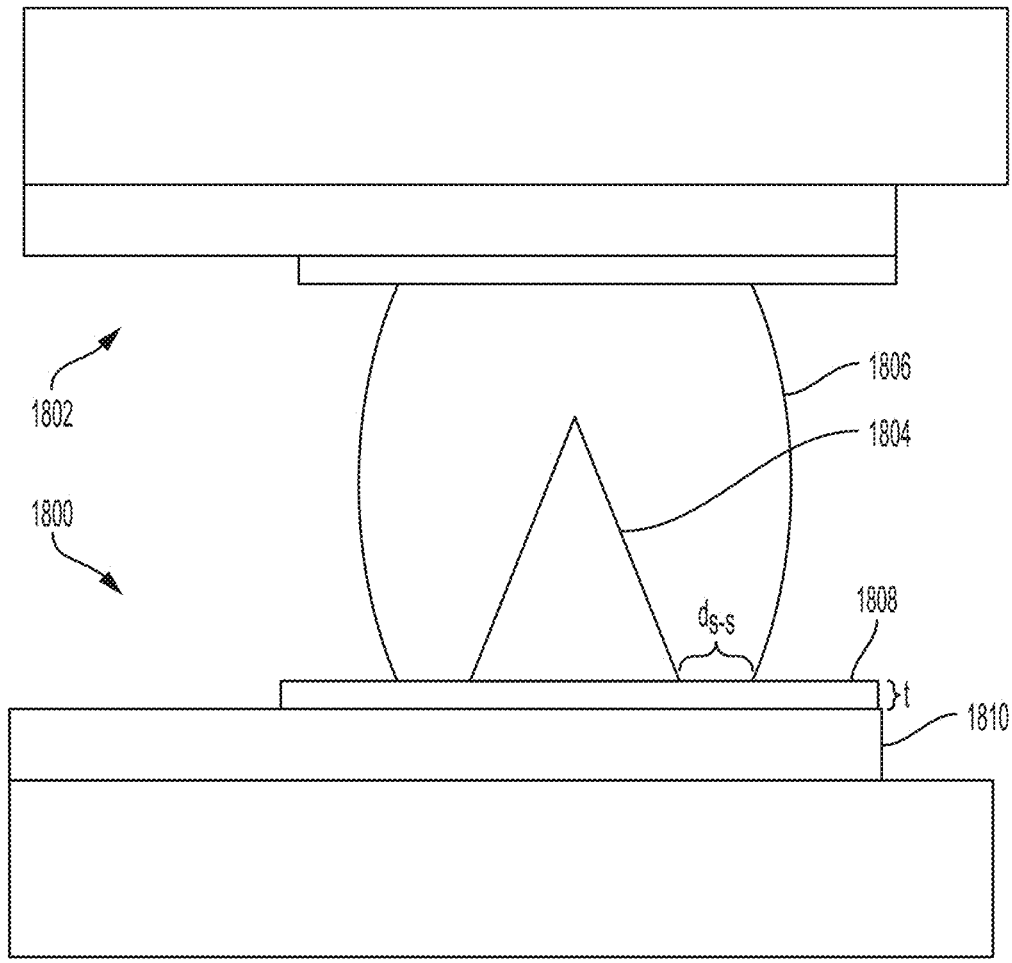
FIG. 18 is a schematic illustration of a qubit chip bonded to an interposer chip.

FIG. 18 is a schematic illustration of a qubit chip 1800 bonded to an interposer chip 1802. According to an embodiment of the invention, the metallic stud 1804 is superconducting. If the metallic stud 1804 is not superconducting, then the distance ds-s over which the solder bump 1806 contacts the metallic plate 1808 is designed to be much greater than the coherence length of the solder bump material. According to an embodiment of the invention, the metallic plate 1808 is inherently superconducting. If the metallic plate 1808 is not inherently superconducting, then the thickness t of the metallic plate 1808 is designed to be small enough to facilitate a superconducting interconnect between the solder bump 1806 and the superconducting wiring 1810 via the proximity effect.

Figure 19:
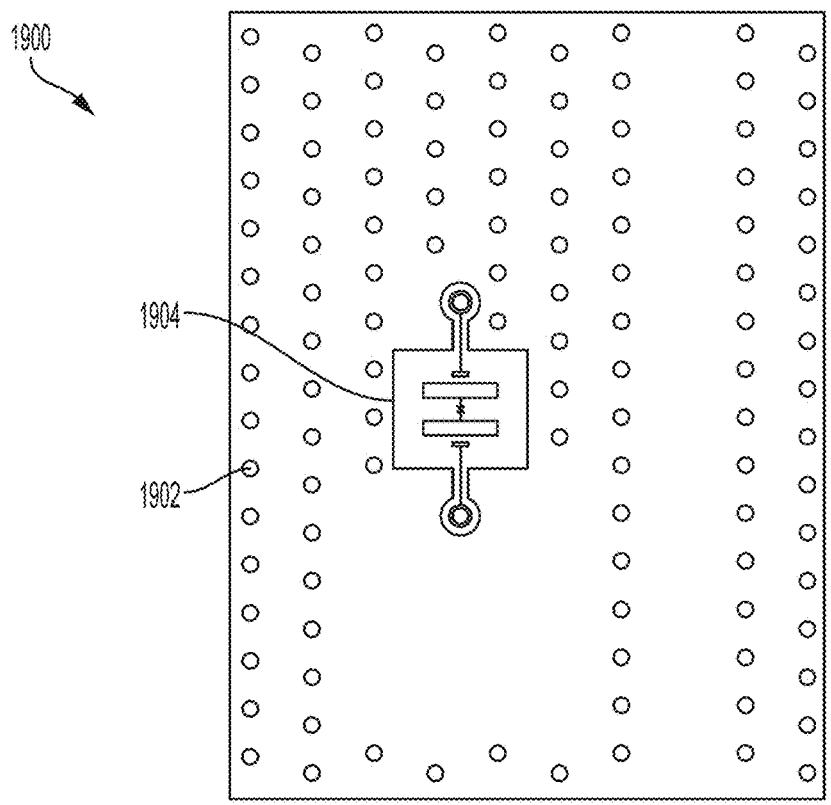
FIG. 19 is a schematic illustration of a qubit chip with gold studs and a qubit.
Figure 20:
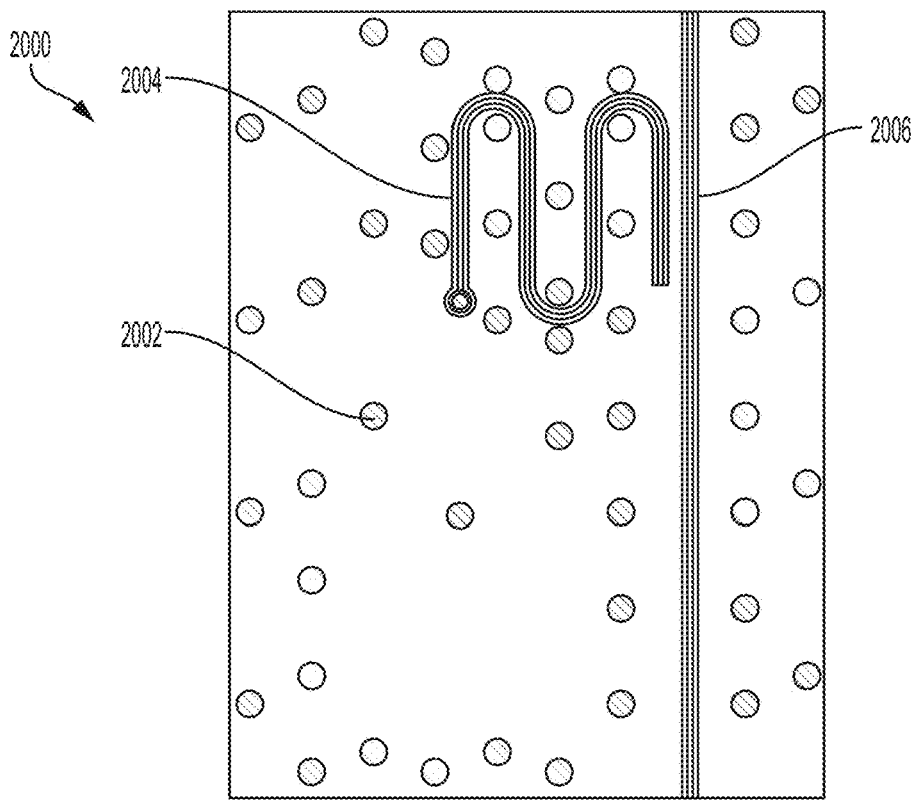
FIG. 20 is a schematic illustration of a test interposer chip with test solder bumps.
Figure 21:
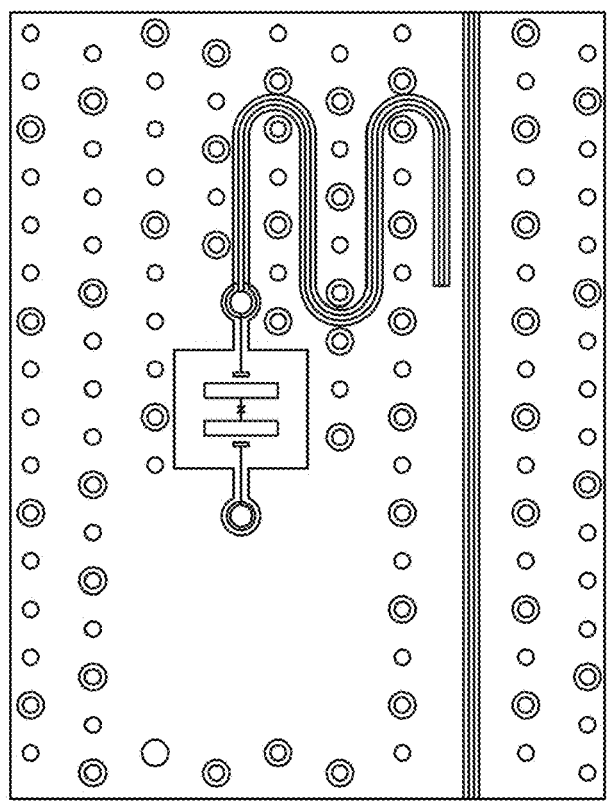
FIG. 21 is a schematic illustration of the qubit chip bonded to the test interposer chip.

FIG. 19 is a schematic illustration of a qubit chip 1900 with gold studs 1902 and a qubit 1904. FIG. 20 is a schematic illustration of a test interposer chip 2000 with test solder bumps 2002. The test interposer chip 2000 also includes a $\lambda/4$ readout resonator 2004 and a coplanar waveguide feedline 2006 for multiplexing. For testing of the qubit frequency, control and readout can be multiplexed through the feedline 2006, simplifying the measurement setup. FIG. 21 is a schematic illustration of the qubit chip bonded to the test interposer chip. The test interposer chip has fewer bumps than the qubit chip has studs to aid the pulling.

Figure 22:
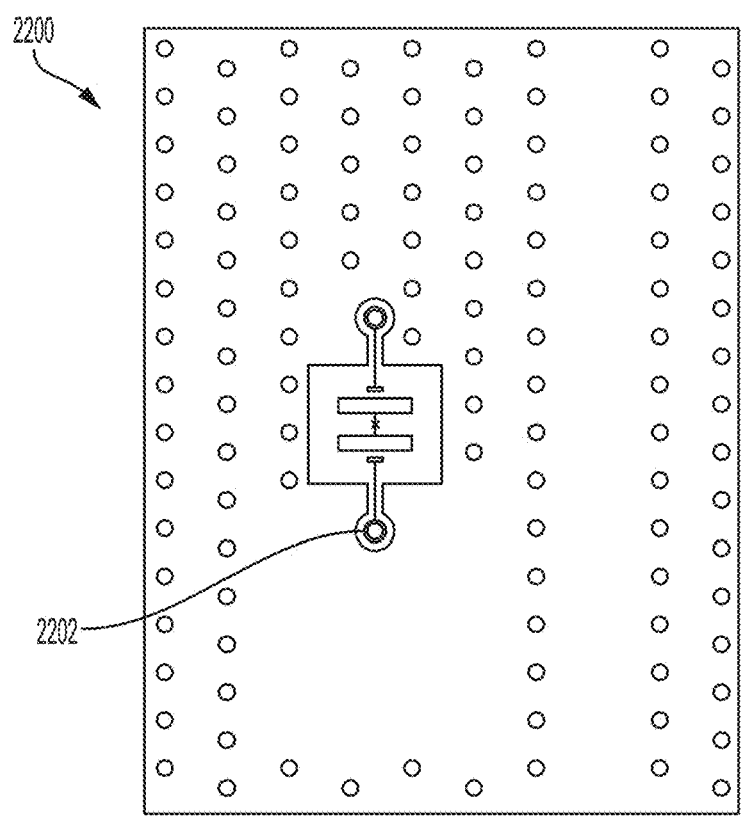
FIG. 22 is a schematic illustration of the qubit chip prior to bonding to the device interposer chip.
Figure 23:
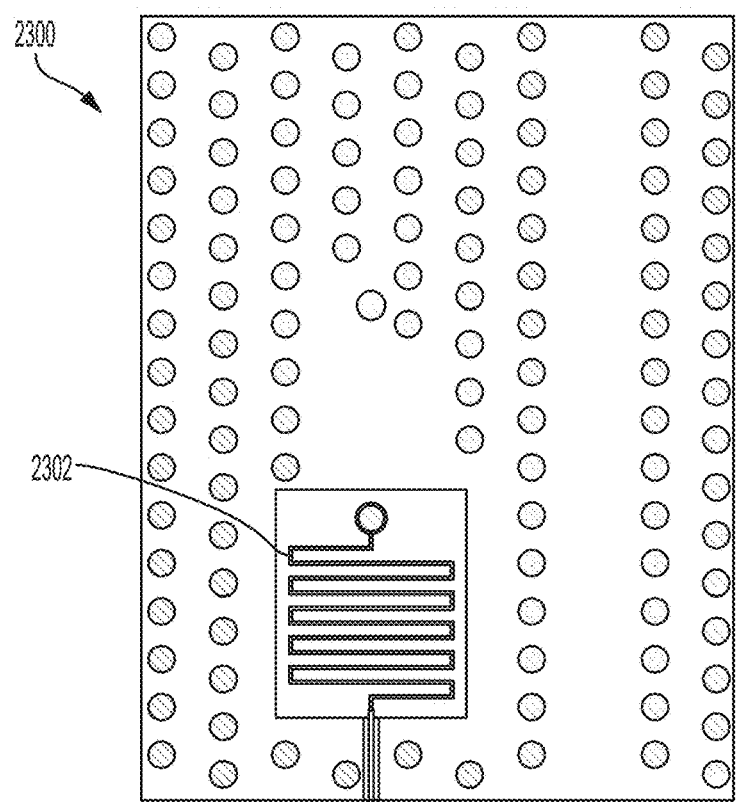
FIG. 23 is a schematic illustration of a device interposer chip prior to bonding to the qubit chip.

FIG. 22 is a schematic illustration of the qubit chip 2000 prior to bonding to the device interposer chip. For the final quantum computer chip, each qubit has individual control, which is required for cross resonance gates, instead of using multiplexed control. The qubit chip 2200 includes the capacitive part 2202 of a readout resonator. FIG. 23 is a schematic illustration of a device interposer chip 2300 prior to bonding to the qubit chip. The device interposer chip 2300 includes the inductive part 2302 of the readout resonator. FIG. 24 is a schematic illustration of the qubit chip bonded to the device interposer chip. The capacitive and inductive parts of the readout resonator form a complete readout resonator in the final quantum computer chip.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of producing a quantum computer chip, comprising:
performing a frequency measurement on a qubit chip bonded to a test interposer chip for qubits on the qubit chip at an operating temperature of the qubit chip;
pulling the qubit chip apart from the test interposer chip after performing the frequency measurement;
modifying a frequency of a subset of qubits after pulling the qubit chip apart from the test interposer chip; and
bonding the qubit chip to a device interposer chip after modifying the frequency of the subset of qubits.

2. The method of claim 1, wherein the device interposer chip is the test interposer chip reused.

3. The method of claim 1, further comprising:
bonding the qubit chip to the test interposer chip prior to performing the frequency measurement; and
cooling the bonded qubit chip and test interposer chip to the operating temperature of the qubit chip.

4. The method of claim 3, wherein the qubit chip comprises at least one metallic pad and a metallic stud formed on each metallic pad,
wherein the test interposer chip comprises at least one metallic pad and a test solder bump formed on each metallic pad,
wherein the device interposer chip comprises at least one metallic pad and a device solder bump formed on each metallic pad,
wherein bonding the qubit chip to the test interposer chip comprises bonding the metallic studs formed on the qubit chip to the test solder bumps formed on the test interposer chip, and
wherein bonding the qubit chip to the device interposer chip comprises bonding the metallic studs formed on the qubit chip to the device solder bumps formed on the device interposer chip.

5. The method according to claim 4, wherein the test solder bumps contact a first area of the metallic pads on which the metallic studs are formed, and
wherein the device solder bumps contact a second area of the metallic pads on which the metallic studs are formed, at least a portion of the second area being different from the first area.

6. The method according to claim 4, wherein the qubit chip further comprises a second metallic stud formed on each metallic pad, and the device interposer chip further comprises at least one second metallic pad and a second device solder bump formed on each second metallic pad,
the method further comprising bonding the second metallic studs formed on the qubit chip to the second device solder bumps formed on the device interposer chip.

7. The method according to claim 4, wherein the qubit chip further comprises at least one metallic plated pillar formed on each metallic pad, and the device interposer chip further comprises at least one second metallic pad and a second device solder bump formed on each second metallic pad,
the method further comprising bonding the metallic plated pillar formed on the qubit chip to the second device solder bump formed on the device interposer chip.

8. The method of claim 4,
wherein the qubit chip comprises a plurality of metallic studs,
wherein the test interposer chip comprises a plurality of test solder bumps, and
wherein the device interposer chip comprises a plurality of device solder bumps.

9. The method of claim 8, wherein the number of test solder bumps in the plurality of test solder bumps is less than the number of metallic studs in the plurality of metallic studs,
wherein the number of test solder bumps in the plurality of test solder bumps is less than the number of device solder bumps in the plurality of device solder bumps,
wherein bonding the qubit chip to the test interposer chip comprises bonding a subset of the plurality of metallic studs to the plurality of test solder bumps, and
wherein bonding the qubit chip to the device interposer chip comprises bonding the plurality of metallic studs to the plurality of device solder bumps.

10. The method of claim 9, wherein the size of each device solder bump is larger than that of each test solder bump.

11. The method of claim 10, wherein the device interposer chip is the test interposer chip reused, the method further comprising removing the test solder bumps from the test interposer chip after the pulling and forming the plurality of device solder bumps on the test interposer chip.

12. The method of claim 8, wherein the qubit chip further comprises a plurality of metallic plated pillars,
- wherein bonding the qubit chip to the test interposer chip comprises bonding the plurality of metallic studs to the plurality of test solder bumps, and
- wherein bonding the qubit chip to the device interposer chip comprises bonding the plurality of metallic studs to a first plurality of the plurality of device solder bumps, and bonding the plurality of metallic plated pillars to a second plurality of the plurality of device solder bumps.

13. The method of claim 12, wherein the number and size of device solder bumps are larger than the number and size of the test solder bumps.

14. The method of claim 13, wherein the device interposer chip is the test interposer chip reused, the method further comprising removing the test solder bumps from the test interposer chip after the pulling and forming the plurality of device solder bumps on the test interposer chip.

15. The method of claim 13, further comprising performing resistance measurements across Josephson junctions formed on the qubit chip prior to bonding the qubit chip to the test interposer chip.

16. The method of claim 13, further comprising heating the bonded qubit chip and test interposer chip to a temperature at which the modifying the frequency can be performed.

17. A quantum computer chip produced according to the method of claim 1.

18. The quantum computer chip according to claim 17, wherein the qubit chip comprises at least one metallic pad and a metallic stud formed on each metallic pad,
- wherein the test interposer chip comprises at least one metallic pad and a test solder bump formed on each metallic pad,
- wherein the device interposer chip comprises at least one metallic pad and a device solder bump formed on each metallic pad, and
- wherein the metallic studs formed on the qubit chip are bonded to the device solder bumps formed on the device interposer chip to form the quantum computer chip.

19. The quantum computer chip according to claim 18, wherein the metallic studs are formed from a material that is not superconducting, and wherein a distance over which the device solder bumps envelope the metallic studs formed on the qubit chip is much greater than the coherence length of the device solder bumps.

20. The quantum computer chip according to claim 18, wherein the metallic studs are formed from a material that is not superconducting, and wherein a distance over which the device solder bumps contact the metallic pads formed on the qubit chip is much greater than the coherence length of the device solder bumps.

21. The quantum computer chip according to claim 18, wherein the test solder bump is formed from a material that is superconducting, and wherein the device solder bump is formed from a material that is superconducting.

22. The quantum computer chip according to claim 18, wherein the qubit chip further comprises a second metallic stud formed on each metallic pad, and the device interposer chip further comprises at least one second metallic pad and a second device solder bump formed on each second metallic pad,
- wherein the second metallic studs are bonded to the second device solder bumps.

23. The quantum computer chip according to claim 18, wherein the qubit chip further comprises at least one metallic plated pillar formed on each metallic pad, and the device interposer chip further comprises at least one second metallic pad and a second device solder bump formed on each second metallic pad,
- wherein the metallic plated pillars are bonded to the second device solder bumps.

24. The quantum computer chip according to claim 18, wherein a portion of the qubit chip and a portion of the device interposer chip form readout resonators.

* * * * *